United States Patent
Ikemoto et al.

(10) Patent No.: US 12,230,423 B2
(45) Date of Patent: Feb. 18, 2025

(54) TRANSMISSION LINE AND ELECTRONIC DEVICE

(71) Applicant: Murata Manufacturing Co., Ltd., Nagaokakyo (JP)

(72) Inventors: Nobuo Ikemoto, Nagaokakyo (JP);
Noriaki Okuda, Nagaokakyo (JP);
Kosuke Nishio, Nagaokakyo (JP);
Masanori Okamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 141 days.

(21) Appl. No.: 18/198,475

(22) Filed: May 17, 2023

(65) Prior Publication Data

US 2023/0290537 A1  Sep. 14, 2023

Related U.S. Application Data

(63) Continuation of application No. PCT/JP2021/042035, filed on Nov. 16, 2021.

(30) Foreign Application Priority Data

Nov. 30, 2020 (JP) .................................. 2020-198385
Mar. 3, 2021 (JP) .................................. 2021-033558

(51) Int. Cl.
  *H01B 7/02* (2006.01)
  *H01B 3/30* (2006.01)
  *H01B 7/04* (2006.01)

(52) U.S. Cl.
  CPC ............. *H01B 7/0225* (2013.01); *H01B 3/30* (2013.01); *H01B 7/04* (2013.01)

(58) Field of Classification Search
  None
  See application file for complete search history.

(56) References Cited

U.S. PATENT DOCUMENTS

RE27,089 E  *  3/1971  Sear et al.  ........... H05K 1/0221
                                                        174/262
5,712,607 A     1/1998  Dittmer et al.
                    (Continued)

FOREIGN PATENT DOCUMENTS

JP       62269401 A      11/1987
JP       09246813 A       9/1997
                    (Continued)

OTHER PUBLICATIONS

International Search Report in PCT/JP2021/042035, mailed Feb. 1, 2022, 3 pages.

(Continued)

*Primary Examiner* — Krystal Robinson
(74) *Attorney, Agent, or Firm* — Keating & Bennett, LLP

(57) ABSTRACT

In a transmission line, a signal conductor layer extends in a front-back direction orthogonal to an up-down direction. A ground conductor layer is above the signal conductor layer. When viewed in a first orthogonal direction, first hollow portions are arranged in the front-back direction in a first direction of the signal conductor layer, and second hollow portions are arranged in the front-back direction in a second direction of the signal conductor layer. Each of regions between adjacent first hollow portions in the front-back direction is a first region. Each of regions between adjacent second hollow portions in the front-back direction is a second region. Each of the first hollow portions overlaps with a corresponding one of the second regions when viewed in a second orthogonal direction. Each of the second hollow portions overlaps with a corresponding one of the first regions when viewed in the second orthogonal direction.

18 Claims, 14 Drawing Sheets

(56) References Cited

U.S. PATENT DOCUMENTS

| | | |
|---|---|---|
| 5,844,450 A | 12/1998 | Buer et al. |
| 2002/0084876 A1 | 7/2002 | Wright et al. |
| 2013/0098671 A1* | 4/2013 | Thurairajaratnam .. H05K 1/024 |
| | | 174/266 |
| 2018/0309182 A1 | 10/2018 | Tida et al. |

FOREIGN PATENT DOCUMENTS

| | | | |
|---|---|---|---|
| JP | 1041710 A | | 2/1998 |
| JP | H1041710 A | * | 2/1998 |
| JP | 2007123740 A | | 5/2007 |
| WO | 2017130731 A1 | | 8/2017 |

OTHER PUBLICATIONS

Written Opinion in PCT/JP2021/042035, mailed Feb. 1, 2022, 4 pages.

\* cited by examiner

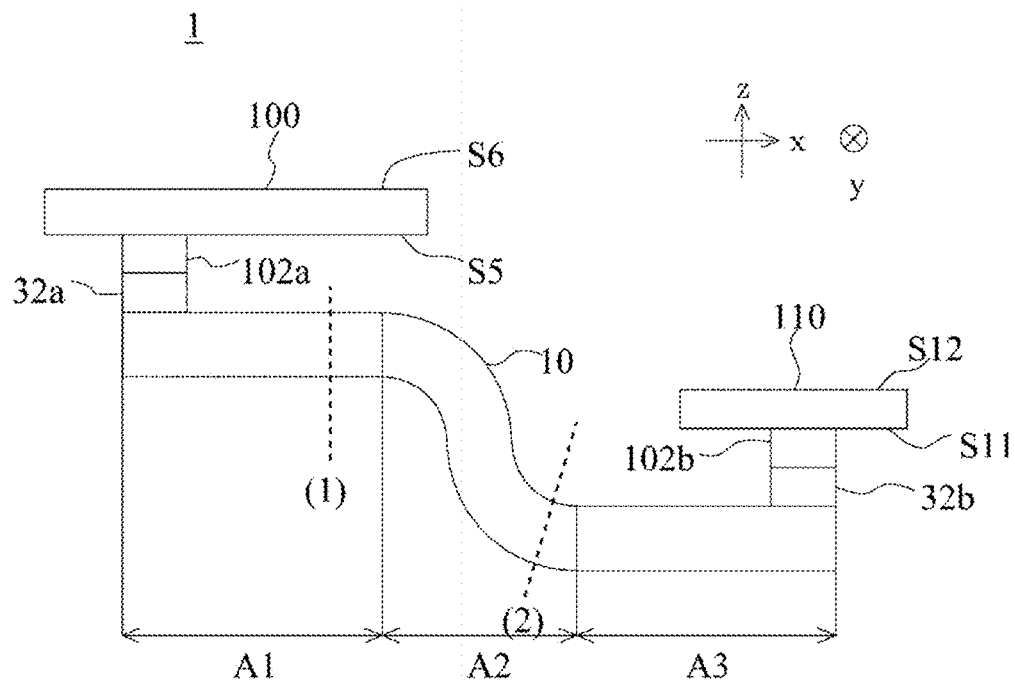
Fig.4
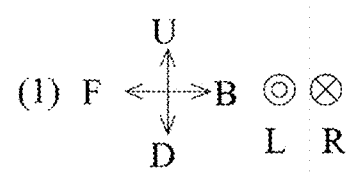
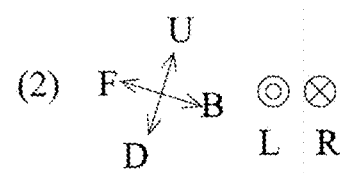

Fig.7
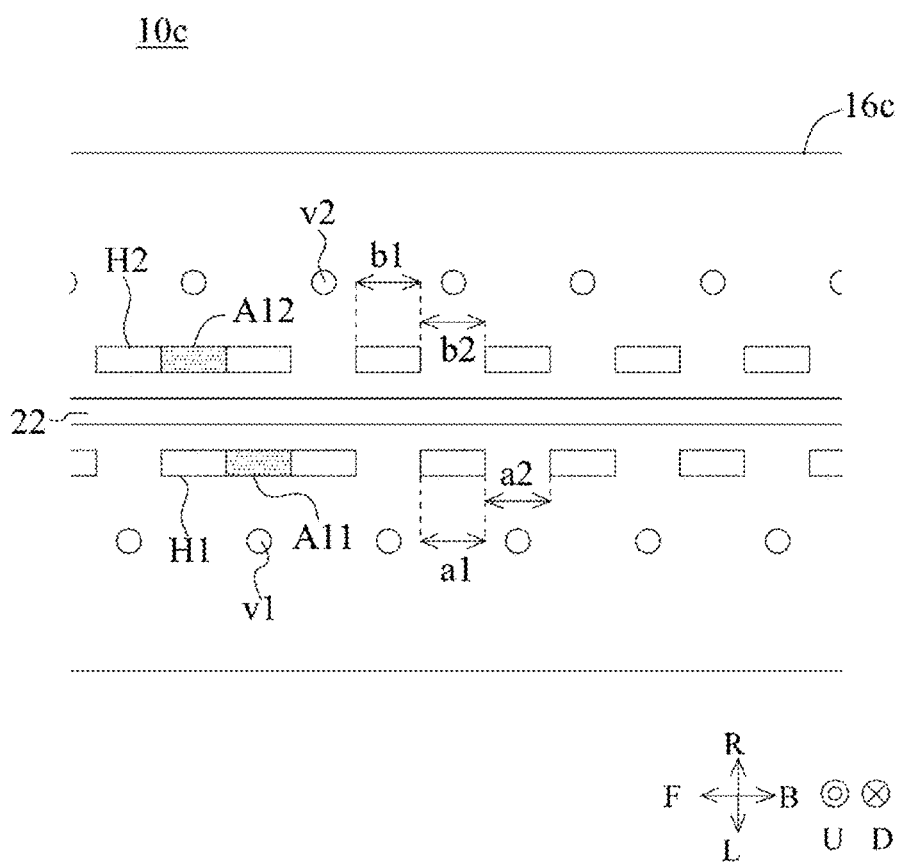
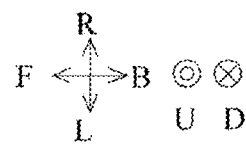

Fig.8
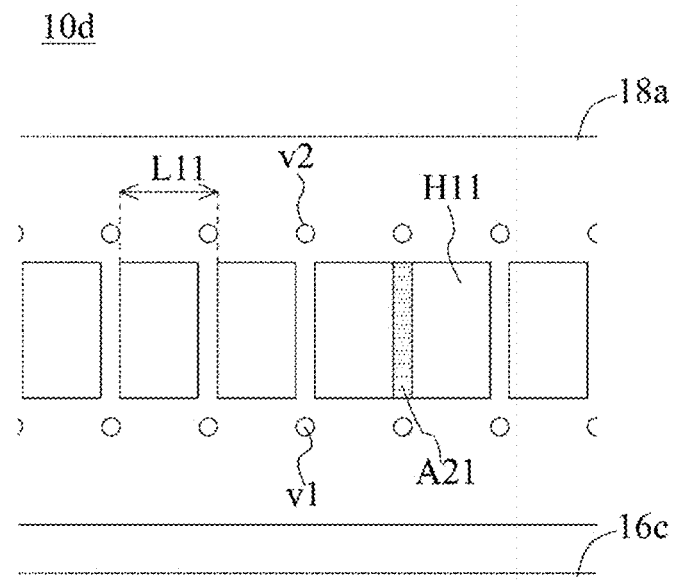
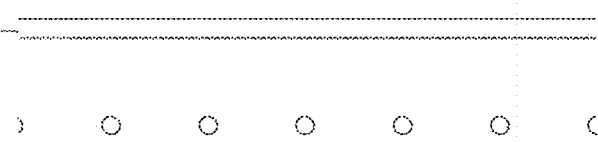
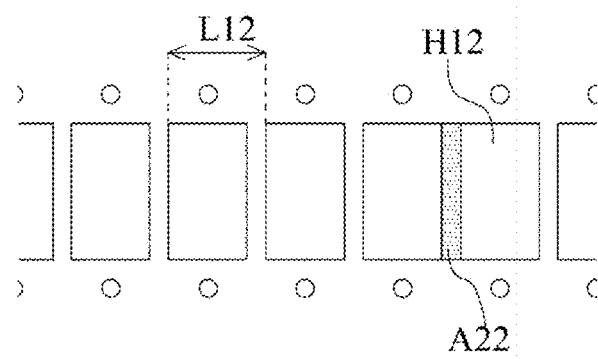

Fig.13
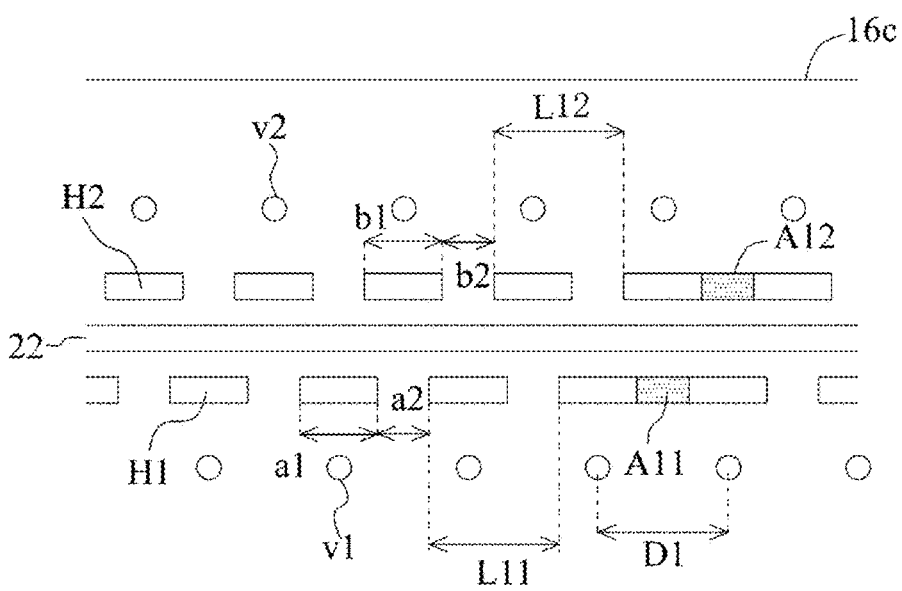
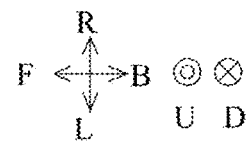

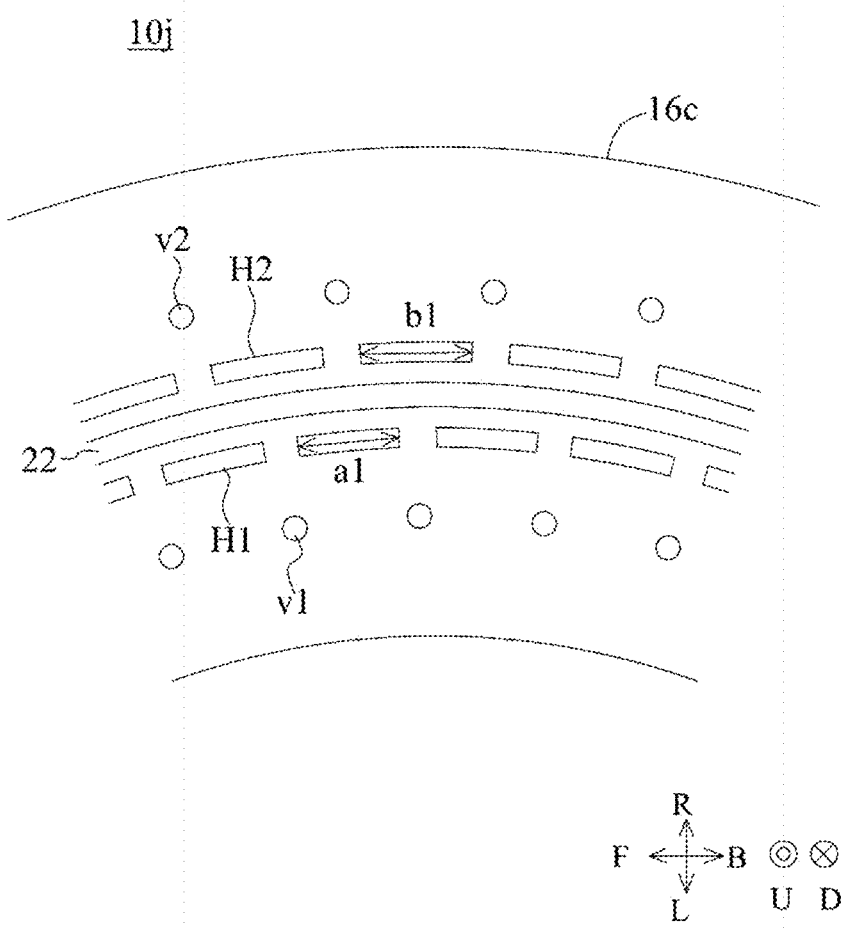

TRANSMISSION LINE AND ELECTRONIC DEVICE

CROSS REFERENCE TO RELATED APPLICATIONS

This application claims the benefit of priority to Japanese Patent Application No. 2020-198385 filed on Nov. 30, 2020 and Japanese Patent Application No. 2021-033558 filed Mar. 3, 2021, and is a Continuation Application of PCT Application No. PCT/JP2021/042035 filed on Nov. 16, 2021. The entire contents of each application are hereby incorporated herein by reference.

BACKGROUND OF THE INVENTION

1. Field of the Invention

The present invention relates to a transmission line through which a high frequency signal is transmitted, and an electronic device.

2. Description of the Related Art

As an invention relating to a conventional transmission line, for example, the suspended line described in Japanese Unexamined Patent Application Publication No. 62-269401 has been known. The suspended line includes an outer conductor, a strip conductor, and a dielectric substrate. The strip conductor is provided on the upper main surface of the dielectric substrate. The strip conductor extends in a front-back direction. The outer conductor is provided above the strip conductor so as to overlap with the strip conductor. The dielectric substrate is provided with pluralities of left through holes and right through holes. The plurality of left through holes is arranged in the front-back direction on the left side of the strip conductor. The plurality of right through holes is arranged in the front-back direction on the right side of the strip conductor.

SUMMARY OF THE INVENTION

In the suspended line described in Japanese Unexamined Patent Application Publication No. 62-269401, the characteristic impedance generated in the strip conductor is likely to largely change. More precisely, the plurality of left through holes is located on the left side of the strip conductor. The plurality of right through holes is located on the right side of the strip conductor. In addition, the position of the plurality of left through holes in the front-back direction coincides with the position of the plurality of right through holes in the front-back direction. Therefore, an existing section in which the left through holes and the right through holes exist on the left and right sides of the strip conductor and a non-existing section in which the left through holes and the right through holes do not exist on the left and right sides of the strip conductor are formed. In the existing section, the permittivity around the strip conductor becomes low. On the other hand, in the non-existing section, the permittivity around the strip conductor becomes high. As a result, the difference between the characteristic impedance generated in the strip conductor in the existing section and the characteristic impedance generated in the strip conductor in the non-existing section is likely to be large. In the suspended line described in Japanese Unexamined Patent Application Publication No. 62-269401, the characteristic impedance generated in the strip conductor is likely to largely change.

Preferred embodiments of the present invention provide transmission lines and electronic devices each capable of reducing or preventing a large change in characteristic impedance generated in a signal conductor layer.

A transmission line according to a preferred embodiment of the present invention includes a multilayer body including a plurality of insulator layers laminated in an up-down direction, a signal conductor layer in the multilayer body and extending in a front-back direction orthogonal to the up-down direction, and a first ground conductor layer in the multilayer body and above the signal conductor layer to overlap with the signal conductor layer when viewed in the up-down direction, wherein the multilayer body includes a plurality of first hollow portions and a plurality of second hollow portions, the plurality of first hollow portions and the plurality of second hollow portions overlap with the first ground conductor layer when viewed in the up-down direction, a direction orthogonal to the front-back direction is a first orthogonal direction, and a direction orthogonal to the front-back direction and the first orthogonal direction is a second orthogonal direction, the second orthogonal direction includes a first direction and a second direction that is a direction opposite to the first direction, when viewed in the first orthogonal direction, the plurality of first hollow portions is arranged in the front-back direction in the first direction of the signal conductor layer, when viewed in the first orthogonal direction, the plurality of second hollow portions is arranged in the front-back direction in the second direction of the signal conductor layer, regions each located between two of the first hollow portions adjacent to each other in the front-back direction are a plurality of first regions, regions each located between two of the second hollow portions adjacent to each other in the front-back direction are a plurality of second regions, each of the plurality of first hollow portions overlaps with a corresponding one of the plurality of second regions when viewed in the second orthogonal direction, and each of the plurality of second hollow portions overlaps with a corresponding one of the plurality of first regions when viewed in the second orthogonal direction.

According to transmission lines and electronic devices according to preferred embodiments of the present invention, a large change in characteristic impedance generated in a signal conductor layer is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a left-side view of an internal structure of an electronic device 1 including the transmission line 10.

FIG. 5 is a top view of the insulator layer 16c of a transmission line 10a.

FIG. 7 is a top view of the insulator layer 16c of a transmission line 10c.

FIG. 8 includes top views of insulator layers 16c, 18a, and 18b of a transmission line 10d.

FIG. 13 is a top view of the insulator layer 16c of a transmission line 10i.

FIG. 14 is a top view of the insulator layer 16c of a transmission line 10j.

DETAILED DESCRIPTION OF THE PREFERRED EMBODIMENTS

Preferred Embodiment

Structure of Transmission Line

Figure 1:
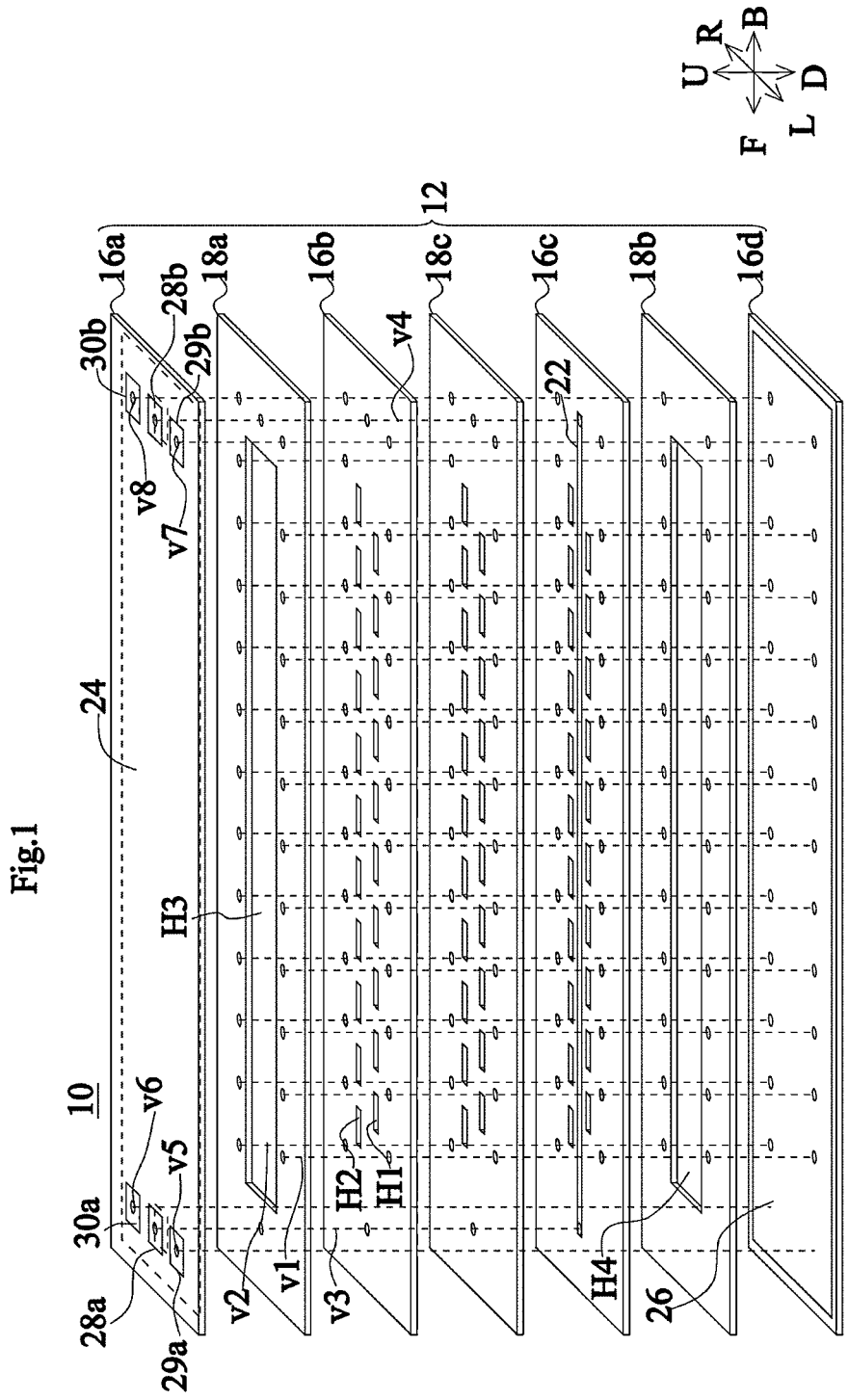
FIG. 1 is an exploded perspective view of a transmission line 10.
Figure 2:
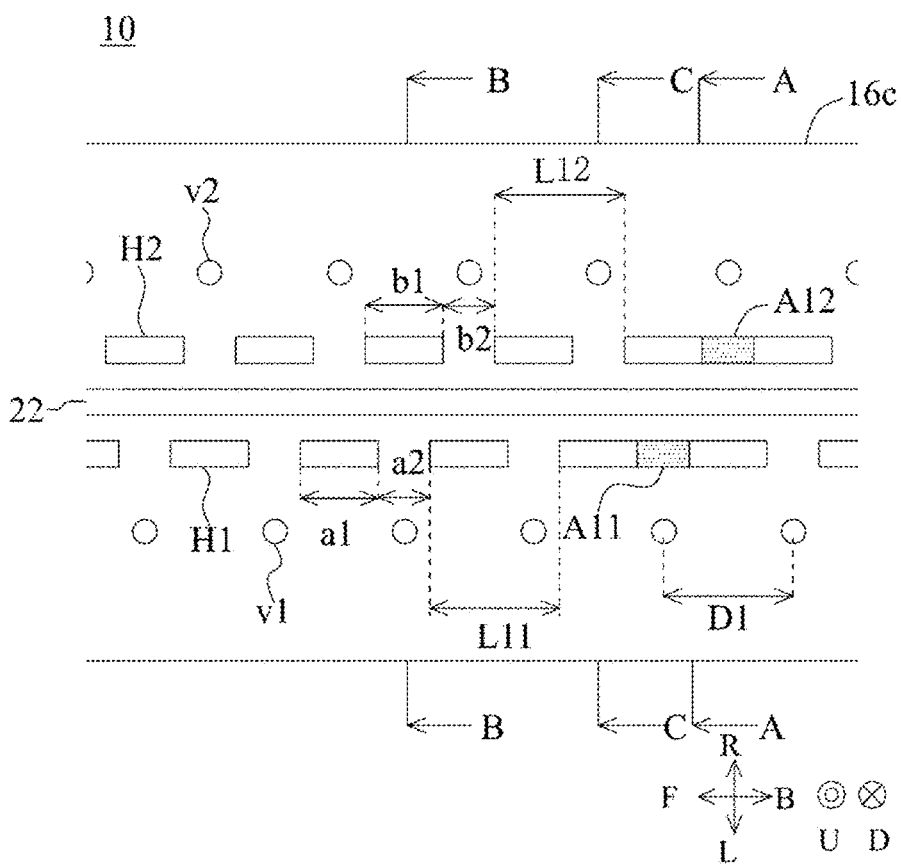
FIG. 2 is a top view of an insulator layer 16c of FIG. 1.
Figure 3:
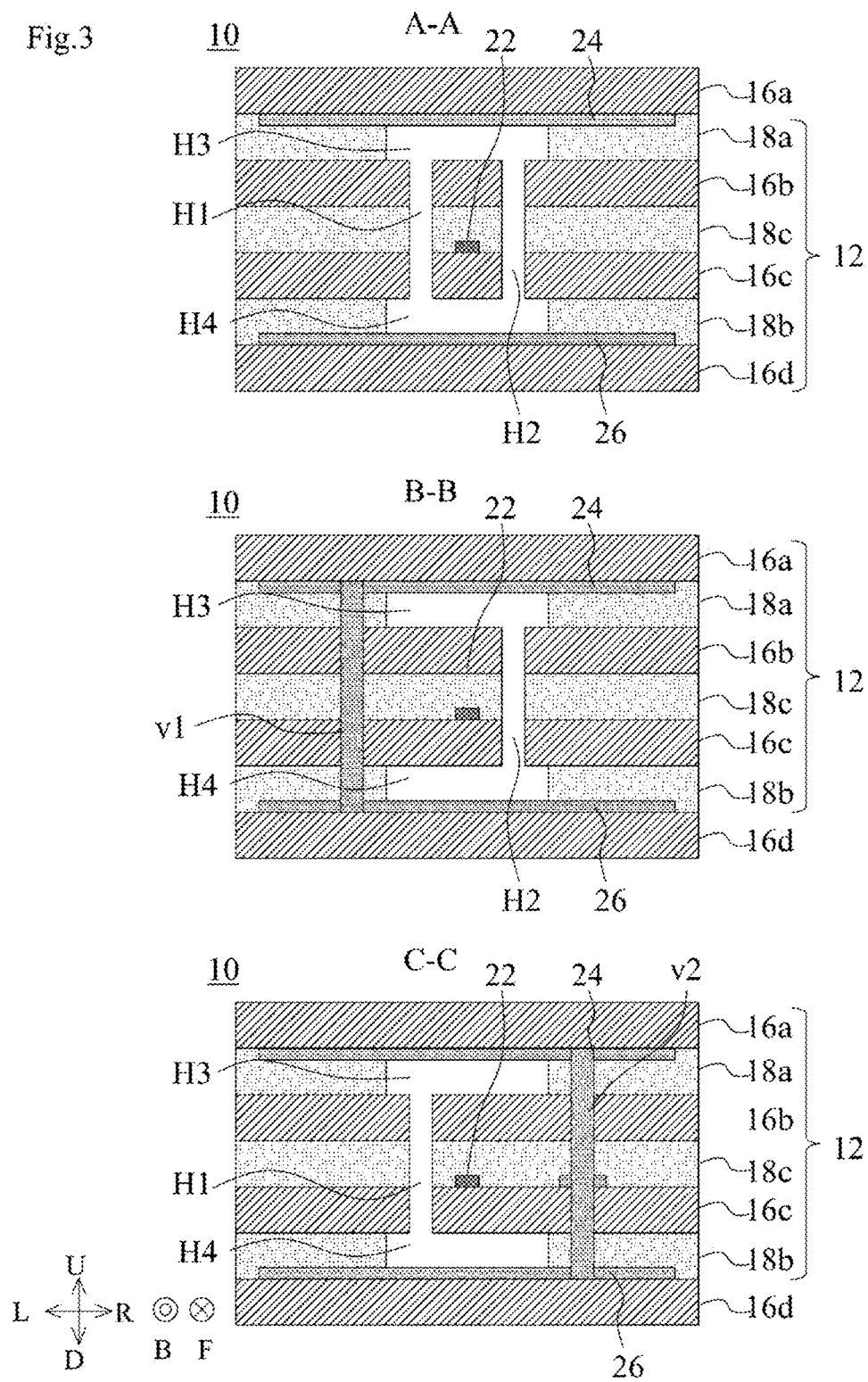
FIG. 3 includes sectional views cut along lines A-A, B-B, and C-C of FIG. 2.

Hereinafter, a structure of a transmission line 10 according to a preferred embodiment of the present invention will be described with reference to the drawings. FIG. 1 is an exploded perspective view of the transmission line 10. Note that in FIG. 1, among a plurality of interlayer connection conductors v1 and a plurality of interlayer connection conductors v2, only representative interlayer connection conductors v1 and v2 are denoted by reference numerals. In FIG. 1, among a plurality of first hollow portions H1 and a plurality of second hollow portions H2, only a representative first hollow portion H1 and second hollow portion H2 are denoted by reference numerals. FIG. 2 is a top view of an insulator layer 16c of FIG. 1. FIG. 3 includes sectional views cut along lines A-A, B-B, and C-C of FIG. 2.

In the specification, directions are defined as follows. A laminating direction of a multilayer body 12 of the transmission line 10 is defined as an up-down direction. In addition, a direction in which a signal conductor layer 22 of the transmission line 10 extends is defined as a front-back direction. In addition, a line width direction of the signal conductor layer 22 is defined as a left-right direction. The up-down direction is orthogonal to the front-back direction. The left-right direction is orthogonal to the up-down direction and the front-back direction. In addition, in the present preferred embodiment, a first orthogonal direction is the up-down direction. A second orthogonal direction is the left-right direction. In addition, the left-right direction includes a left direction and a right direction that is a direction opposite to the left direction. In the present preferred embodiment, a first direction is the left direction. A second direction is the right direction.

Hereinafter, X is a component or a member of the transmission line 10. In the specification, each portion of X is defined as follows, unless otherwise noted. A front portion of X refers to the first half of X. A back portion of X refers to the latter half of X. A left portion of X refers to the left half of X. A right portion of X refers to the right half of X. An upper portion of X refers to the upper half of X. A lower portion of X refers to the lower half of X. A front end of X refers to the end in the front direction of X. A back end of X refers to the end in the back direction of X. A left end of X refers to the end in the left direction of X. A right end of X refers to the end in the right direction of X. An upper end of X refers to the end in the up direction of X. A lower end of X refers to the end in the down direction of X. A front end portion of X refers to the front end of X and the vicinity thereof. A back end portion of X refers to the back end of X and the vicinity thereof. A left end portion of X refers to the left end of X and the vicinity thereof. A right end portion of X refers to a right end of X and the vicinity thereof. An upper end portion of X refers to the upper end of X and the vicinity thereof. A lower end portion of X refers to the lower end of X and the vicinity thereof.

First, with reference to FIG. 1, the structure of the transmission line 10 will be described. The transmission line 10 transmits a high frequency signal. The transmission line 10 is used to electrically connect two circuits in an electronic device such as a smartphone. As illustrated in FIG. 1, the transmission line 10 includes the multilayer body 12, the signal conductor layer 22, a first ground conductor layer 24, a second ground conductor layer 26, signal terminals 28a and 28b, ground terminals 29a, 29b, 30a, and 30b, the plurality of interlayer connection conductors v1, the plurality of interlayer connection conductors v2, and interlayer connection conductors v3 to v8.

The multilayer body 12 has a plate shape. Therefore, the multilayer body 12 includes an upper main surface and a lower main surface. The upper main surface and the lower main surface of the multilayer body 12 each have a rectangular or substantially rectangular shape having a long side extending in the front-back direction. Therefore, the length of the multilayer body 12 in the front-back direction is greater than the length of the multilayer body 12 in the left-right direction.

As illustrated in FIG. 1, the multilayer body 12 includes insulator layers 16a to 16d, and 18a to 18c. The multilayer body 12 has a structure in which the insulator layers 16a to 16d, and 18a to 18c are laminated in the up-down direction. The insulator layers 16a, 18a, 16b, 18c, 16c, 18b, and 16d are arranged in this order from up to down. The insulator layers 16a to 16d, and 18a to 18c each have the same rectangular or substantially rectangular shape as the multilayer body 12 when viewed in the up-down direction. The insulator layers 16a to 16d are flexible dielectric sheets. The material of the insulator layers 16a to 16d is, for example, a thermoplastic resin. The thermoplastic resin is, for example, a thermoplastic resin of a liquid-crystal polymer, polytetrafluoroethylene (PTFE), and the like. The material of the insulator layers 16a to 16d may be polyimide.

The insulator layers 18a to 18c each define and function as an adhesion layer. Therefore, the insulator layer 18a (adhesion layer) joins the insulator layer 16a located above the insulator layer 18a (adhesion layer) to the insulator layer 16b located below the insulator layer 18a (adhesion layer). The insulator layer 18b (adhesion layer) joins the insulator layer 16c located above the insulator layer 18b (adhesion layer) to the insulator layer 16d located below the insulator layer 18b (adhesion layer). The insulator layer 18c joins the insulator layer 16b to the insulator layer 16c. Therefore, the material of the insulator layers 18a to 18c is different from the material of the insulator layers 16a to 16d. The material of the insulator layers 18a to 18c is, for example, an epoxy resin, a fluororesin, an acrylic resin, or the like.

As illustrated in FIG. 1, the signal conductor layer 22 is provided in the multilayer body 12. The signal conductor layer 22 is provided on the insulator layer 16c located below the insulator layer 18c (adhesion layer). In the present preferred embodiment, the signal conductor layer 22 is provided on the upper main surface of the insulator layer 16c. As a result, the signal conductor layer 22 is provided in the multilayer body 12. The signal conductor layer 22 has a line shape. The signal conductor layer 22 extends in the front-back direction orthogonal to the up-down direction. The signal conductor layer 22 is located in the center in the left-right direction of the upper main surface of the insulator layer 16c.

As illustrated in FIG. 1, the first ground conductor layer 24 is provided in the multilayer body 12. The first ground conductor layer 24 is provided above the signal conductor layer 22 so as to overlap with the signal conductor layer 22 when viewed in the up-down direction. The first ground conductor layer 24 is provided on the insulator layer 16a located above the insulator layer 18a (adhesion layer). In the present preferred embodiment, the first ground conductor layer 24 is provided on the lower main surface of the insulator layer 16a. In addition, the first ground conductor layer 24 covers the entire or substantially the entire surface of the lower main surface of the insulator layer 16a.

As illustrated in FIG. 1, the second ground conductor layer 26 is provided in the multilayer body 12. The second ground conductor layer 26 is provided below the signal conductor layer 22 so as to overlap with the signal conductor layer 22 when viewed in the up-down direction. In the present preferred embodiment, the second ground conductor layer 26 is provided on the upper main surface of the insulator layer 16d. In addition, the second ground conductor layer 26 covers the entire or substantially the entire surface of the upper main surface of the insulator layer 16d. The signal conductor layer 22, the first ground conductor layer 24, and the second ground conductor layer 26 described above have a strip line structure.

The pluralities of interlayer connection conductors v1 and v2 electrically connect the first ground conductor layer 24 to the second ground conductor layer 26. More precisely, the pluralities of interlayer connection conductors v1 and v2 penetrate the insulator layers 16b, 16c, and 18a to 18c in the up-down direction. The upper end portions of the pluralities of interlayer connection conductors v1 and v2 are connected to the first ground conductor layer 24. The lower end portions of the pluralities of interlayer connection conductors v1 and v2 are connected to the second ground conductor layer 26. The plurality of interlayer connection conductors v1 is provided on the left side of the signal conductor layer 22. The plurality of interlayer connection conductors v1 is arranged in a line in the front-back direction at equal or substantially equal intervals. The plurality of interlayer connection conductors v2 is provided on the right side of the signal conductor layer 22. The plurality of interlayer connection conductors v2 is arranged in a line in the front-back direction at equal or substantially equal intervals.

The signal terminal 28a is provided on the upper main surface of the multilayer body 12. More precisely, the signal terminal 28a is provided in the front end portion of the upper main surface of the insulator layer 16a. The signal terminal 28a overlaps with the front end portion of the signal conductor layer 22 when viewed in the up-down direction. The signal terminal 28a has a rectangular or substantially rectangular shape when viewed in the up-down direction.

The interlayer connection conductor v3 electrically connects the signal terminal 28a to the signal conductor layer 22. Specifically, the interlayer connection conductor v3 penetrates the insulator layers 16a, 16b, 18a, and 18c in the up-down direction. The upper end of the interlayer connection conductor v3 is connected to the signal terminal 28a. The lower end of the interlayer connection conductor v3 is connected to the front end portion of the signal conductor layer 22. As a result, the signal terminal 28a is electrically connected to the signal conductor layer 22. In addition, the first ground conductor layer 24 is not provided around the interlayer connection conductor v3 so that the interlayer connection conductor v3 is insulated from the first ground conductor layer 24. A high frequency signal is input to and output from the signal conductor layer 22 through the signal terminal 28a.

Note that the signal terminal 28b and the interlayer connection conductor v4 have structures symmetrical in the front-back direction to the structures of the signal terminal 28a and the interlayer connection conductor v3, respectively. Therefore, the description of the signal terminal 28b and the interlayer connection conductor v4 will be omitted.

The ground terminal 29a is provided on the upper main surface of the multilayer body 12. More precisely, the ground terminal 29a is provided in the front end portion of the upper main surface of the insulator layer 16a. The ground terminal 29a is provided on the left side of the signal terminal 28a. The ground terminal 29a overlaps with the first ground conductor layer 24 when viewed in the up-down direction. The ground terminal 29a has a rectangular or substantially rectangular shape when viewed in the up-down direction.

The interlayer connection conductor v5 electrically connects the ground terminal 29a to the first ground conductor layer 24 and the second ground conductor layer 26. Specifically, the interlayer connection conductor v5 penetrates the insulator layers 16a to 16c, and 18a to 18c in the up-down direction. The upper end of the interlayer connection conductor v5 is connected to the ground terminal 29a. The middle portion of the interlayer connection conductor v5 is connected to the first ground conductor layer 24. The lower end of the interlayer connection conductor v5 is connected to the second ground conductor layer 26. As a result, the ground terminal 29a is electrically connected to the first ground conductor layer 24 and the second ground conductor layer 26. The first ground conductor layer 24 and the second ground conductor layer 26 are connected to the ground potential through the ground terminal 29a. Note that the ground terminal 30a and the interlayer connection conductor v6 have structures symmetrical in the left-right direction to the structures of the ground terminal 29a and the interlayer connection conductor v5, respectively. Therefore, the description of the ground terminal 30a and the interlayer connection conductor v6 will be omitted.

In addition, the ground terminals 29b and 30b, and the interlayer connection conductors v7 and v8 have structures symmetrical in the front-back direction to the structures of the ground terminals 29a and 30a, and the interlayer connection conductors v5 and v6, respectively. Therefore, the description of the ground terminals 29b and 30b, and the interlayer connection conductors v7 and v8 will be omitted.

The signal conductor layer 22, the first ground conductor layer 24, the second ground conductor layer 26, the signal terminals 28a and 28b, and the ground terminals 29a, 29b, 30a, and 30b described above are formed by, for example, performing etching on metal foils provided on the upper main surfaces or the lower main surfaces of the insulator layers 16a to 16d. The metal foils are, for example, copper foils. In addition, the interlayer connection conductors v1 to v8 are, for example, through hole conductors. The through hole conductors are manufactured by forming through holes penetrating a portion or all of the insulator layers 16a to 16d, and 18a and 18b and performing plating on the through holes. Note that the interlayer connection conductors v1 to v8 may be via hole conductors. The via hole conductors are manufactured by forming through holes penetrating a portion or all of the insulator layers 16a to 16d, and 18a and 18b, filling the through holes with conductive paste, and sintering the conductive paste.

Next, with reference to FIGS. 1 to 3, the first hollow portion H1 and the second hollow portion H2 will be described. The plurality of first hollow portions H1 is provided in the multilayer body 12. The first hollow portions H1 are hollows in which the insulator layers 16b and 16c do not exist. In the specification, in a hollow portion, a resin residual generated by performing etching on an insulator layer may exist. However, since the hollow portion is a space where a resin does not exist, the resin residual is not a part of the hollow portion. More precisely, when viewed in the up-down direction (the first orthogonal direction), the plurality of first hollow portions H1 is arranged in the front-back direction on the left side (the first direction) of the signal conductor layer 22. The plurality of first hollow portions H1 is arranged in a line. The plurality of first hollow portions H1 is arranged at equal or substantially equal intervals. In addition, each of the plurality of first hollow portions H1 has the same shape. Specifically, the plurality of first hollow portions H1 penetrates the insulator layers 16b and 16c in the up-down direction. That is, the plurality of first hollow portions H1 penetrates the insulator layer 16c provided with the signal conductor layer 22 in the up-down direction. As a result, when viewed in the left-right direction, the plurality of first hollow portions H1 overlaps with the signal conductor layer 22. As illustrated in FIG. 2, the plurality of first hollow portions H1 has a rectangular or substantially rectangular shape when viewed in the up-down direction. The long side of the plurality of first hollow portions H1 extends in the front-back direction. The short side of the plurality of first hollow portions H1 extends in the left-right direction. The plurality of first hollow portions H1 described above overlaps with the first ground conductor layer 24 when viewed in the up-down direction.

In addition, as illustrated in FIG. 2, each of regions located between two first hollow portions H1 adjacent to each other in the front-back direction is defined as a first region A11. A plurality of the first regions A11 is arranged in the front-back direction at equal or substantially equal intervals. Note that in FIG. 2, only one representative first region A11 is denoted by a reference numeral.

The plurality of second hollow portions H2 is provided in the multilayer body 12. The second hollow portions H2 are hollows in which the insulator layers 16b and 16c do not exist. The plurality of second hollow portions H2 has the same shape as the plurality of first hollow portions H1. More precisely, when viewed in the up-down direction (the first orthogonal direction), the plurality of second hollow portions H2 is arranged in the front-back direction on the right side (the second direction) of the signal conductor layer 22. The plurality of second hollow portions H2 is arranged in a line. The plurality of second hollow portions H2 is arranged at equal or substantially equal intervals. In addition, each of the plurality of second hollow portions H2 has the same shape. Specifically, the plurality of second hollow portions H2 penetrates the insulator layers 16b and 16c in the up-down direction. That is, the plurality of second hollow portions H2 penetrates the insulator layer 16c provided with the signal conductor layer 22 in the up-down direction. As a result, when viewed in the left-right direction, the plurality of second hollow portions H2 overlaps with the signal conductor layer 22. As illustrated in FIG. 2, the plurality of second hollow portions H2 has a rectangular or substantially rectangular shape when viewed in the up-down direction. The long side of the plurality of second hollow portions H2 extends in the front-back direction. The short side of the plurality of second hollow portions H2 extends in the left-right direction. The plurality of second hollow portions H2 described above overlaps with the first ground conductor layer 24 when viewed in the up-down direction.

In addition, as illustrated in FIG. 2, each of regions located between two second hollow portions H2 adjacent to each other in the front-back direction is defined as a second region A12. A plurality of the second regions A12 is arranged in the front-back direction at equal or substantially equal intervals. Note that in FIG. 2, only one representative second region A12 is denoted by a reference numeral.

As described above, the plurality of first hollow portions H1 and the plurality of second hollow portions H2 are each periodically arranged. A length L11 of one period of the plurality of first hollow portions H1 is equal to a length L12 of one period of the plurality of second hollow portions H2. The length L11 of one period of the plurality of first hollow portions H1 is a total length of a length a1 of each first hollow portion H1 in the front-back direction and a length a2 of the first region A11 in the front-back direction. The length L12 of one period of the plurality of second hollow portions H2 is a total length of a length b1 of each second hollow portion H2 in the front-back direction and the length b2 of the second region A12 in the front-back direction. However, the position of the plurality of first hollow portions H1 in the front-back direction is deviated from the position of the plurality of second hollow portions H2 in the front-back direction by the length of a half period in the front-back direction. As a result, each of the plurality of first hollow portions H1 is located on the left side (the first direction) of the plurality of second regions A12. That is, each of the plurality of first hollow portions H1 overlaps with a corresponding one of the plurality of second regions A12 when viewed in the left-right direction (the second orthogonal direction). Each of the plurality of second hollow portions H2 is located on the right side (the second direction) of the plurality of first regions A11. That is, each of the plurality of second hollow portions H2 overlaps with a corresponding one of the plurality of first regions A11 when viewed in the left-right direction (the second orthogonal direction).

However, the length a1 of the plurality of first hollow portions H1 in the front-back direction is longer than the length a2 of the plurality of first regions A11 in the front-back direction. The length b1 of the plurality of second hollow portions H2 in the front-back direction is longer than a length b2 of the plurality of second regions A12 in the front-back direction. As a result, the front end portion of each first hollow portion H1 overlaps with the second hollow portion H2 located on the right-front side of the first hollow portion H1 when viewed in the left-right direction (the second orthogonal direction). That is, the front end portion of the first hollow portion H1 overlaps with the second hollow portion H2 located before the second region A12 located on the right side (the second direction) of the first hollow portion H1 when viewed in the left-right direction (the second orthogonal direction). That is, the back end portion of the first hollow portion H1 overlaps with the second hollow portion H2 located on the right-back side of the first hollow portion H1 when viewed in the left-right direction (the second orthogonal direction). The back end portion of the first hollow portion H1 overlaps with the second hollow portion H2 located after the second region A12 located on the right side (the second direction) of the first hollow portion H1 when viewed in the left-right direction (the second orthogonal direction). The front end portion of the second hollow portion H2 overlaps with the first hollow portion H1 located on the left-front side of the second hollow portion H2 when viewed in the left-right direction (the second orthogonal direction). That is, the front end portion of the second hollow portion H2 overlaps with the first hollow portion H1 located before the first region A11 located on the left side (the first direction) of the second hollow portion H2 when viewed in the left-right direction (the second orthogonal direction). The back end portion of the second hollow portion H2 overlaps with the first hollow portion H1 located on the left-back side of the second hollow portion H2 when viewed in the left-right direction (the second orthogonal direction). That is, the back end portion of the second hollow portion H2 overlaps with the first hollow portion H1 located after the first region A11 located on the left side (the first direction) of the second hollow portion H2 when viewed in the left-right direction (the second orthogonal direction).

Next, with reference to FIGS. 1 to 3, a third hollow portion H3 and a fourth hollow portion H4 will be described. The third hollow portion H3 is provided in the multilayer body 12. The third hollow portion H3 is a hollow in which the insulator layer 18a does not exist. The third hollow portion H3 penetrates the insulator layer 18a in the up-down direction. The third hollow portion H3 has a rectangular or substantially rectangular shape when viewed in the up-down direction. The long side of the third hollow portion H3 extends in the front-back direction. The short side of the third hollow portion H3 extends in the left-right direction. The third hollow portion H3 overlaps with the plurality of first hollow portions H1, the plurality of second hollow portions H2, and the signal conductor layer 22. However, the third hollow portion H3 does not overlap with both ends of the signal conductor layer 22 when viewed in the up-down direction. As a result, the third hollow portion H3 is connected to the plurality of first hollow portions H1 and the plurality of second hollow portions H2.

Next, the fourth hollow portion H4 is provided in the multilayer body 12. The fourth hollow portion H4 has the same shape as the third hollow portion H3. The fourth hollow portion H4 is a hollow in which the insulator layer 18b does not exist. The fourth hollow portion H4 penetrates the insulator layer 18b in the up-down direction. The fourth hollow portion H4 has a rectangular or substantially rectangular shape when viewed in the up-down direction. The long side of the fourth hollow portion H4 extends in the front-back direction. The short side of the fourth hollow portion H4 extends in the left-right direction. The fourth hollow portion H4 overlaps with the plurality of first hollow portions H1, the plurality of second hollow portions H2, and the signal conductor layer 22. However, the fourth hollow portion H4 does not overlap with both ends of the signal conductor layer 22 when viewed in the up-down direction. As a result, the fourth hollow portion H4 is connected to the plurality of first hollow portions H1 and the plurality of second hollow portions H2.

Structure of Electronic Device

Next, a structure of an electronic device 1 including the transmission line 10 will be described with reference to the drawings. FIG. 4 is a left-side view of an internal structure of the electronic device 1 including the transmission line 10. The electronic device 1 is, for example, a wireless mobile communication terminal. The electronic device 1 is, for example, a smartphone.

As illustrated in FIG. 4, the transmission line 10 can be bent. "The transmission line 10 can be bent" means that when an external force is added to the transmission line 10, the transmission line 10 is deformed and bent. The deformation may be elastic deformation, plastic deformation, or elastic deformation and plastic deformation. Hereinafter, a section in which the transmission line 10 is bent is referred to as a bending section A2. Sections in which the transmission line 10 is not bent are referred to as non-bending sections A1 and A3. In addition, an x-axis, a y-axis, and a z-axis in the electronic device 1 will be defined as follows. The x-axis is the front-back direction in the non-bending section A1. The y-axis is the left-right direction in the non-bending section A1. The z-axis is the up-down direction in the non-bending section A1. The non-bending section A1, the bending section A2, and the non-bending section A3 are arranged in this order in the positive direction of the x-axis.

As illustrated in FIG. 4, the bending section A2 is bent in the z-axis direction. Therefore, as illustrated in FIG. 4, the up-down direction and the front-back direction are different depending on the position of the transmission line 10. In the non-bending section A1 and the non-bending section A3 in which the multilayer body 12 is not bent (for example, at the position of (1)), the up-down direction and the front-back direction coincide with the z-axis direction and the x-axis direction, respectively. On the other hand, in the bending section A2 in which the multilayer body 12 is bent (for example, at the position of (2)), the up-down direction and the front-back direction do not coincide with the z-axis direction and the x-axis direction, respectively.

As illustrated in FIG. 4, the electronic device 1 includes the transmission line 10, connectors 32a, 32b, 102a, and 102b, and circuit boards 100 and 110.

The circuit boards 100 and 110 each have a plate shape. The circuit board 100 includes main surfaces S5 and S6. The main surface S5 is located further on the negative direction side of the z-axis than is the main surface S6. The circuit board 110 includes main surfaces S11 and S12. The main surface S11 is located further on the negative direction side of the z-axis than is the main surface S12. The circuit boards 100 and 110 include a wiring conductor layer, a ground conductor layer, an electrode, and the like that are not illustrated.

The connectors 32a and 32b are mounted on main surfaces (upper main surfaces) on the positive direction side of the z-axis of the non-bending section A1 and the non-bending section A3, respectively. More precisely, the connector 32a is mounted on the signal terminal 28a, and the ground terminals 29a and 30a. The connector 32b is mounted on the signal terminal 28b, and the ground terminals 29b and 30b.

The connectors 102a and 102b are mounted on the main surface S5 of the circuit board 100 and the main surface S11 of the circuit board 110, respectively. The connectors 102a and 102b are connected to the connectors 32a and 32b, respectively. As a result, the transmission line 10 electrically connects the circuit board 100 to the circuit board 110.

Effects

According to the transmission line 10, a large change of the characteristic impedance generated in the signal conductor layer 22 can be reduced or prevented. More precisely, the plurality of first hollow portions H1 and the plurality of second hollow portions H2 are each periodically arranged. The length L11 of one period of the plurality of first hollow portions H1 is equal to the length L12 of one period of the plurality of second hollow portions H2. However, the position of the plurality of first hollow portions H1 is deviated from the position of the plurality of second hollow portions H2 in the front-back direction by the length of a half period. As a result, each of the plurality of first hollow portions H1 overlaps with a corresponding one of the plurality of second regions A12 when viewed in the left-right direction. Each of the plurality of second hollow portions H2 overlaps with a corresponding one of the plurality of first regions A11 when viewed in the left-right direction. As a result, the first hollow portions H1 or the second hollow portions H2 exist on at least one of the left side or the right side of the signal conductor layer 22. That is, a section in which none of the first hollow portions H1 and the second hollow portions H2 exists on both of the left and right sides of the signal conductor layer 22 is less likely to be generated in the signal conductor layer 22. Therefore, the first regions A11 and the second regions A12 are less likely to be arranged in the left-right direction. As a result, an excessive increase in the permittivity around the signal conductor layer 22 can be reduced or prevented. An excessive decrease in the characteristic impedance generated in the signal conductor layer 22 can be reduced or prevented. From the above, according to the transmission line 10, a large change of the characteristic impedance generated in the signal conductor layer 22 can be reduced or prevented. As a result, in the transmission line 10, reflection of a high frequency signal can be reduced or prevented.

According to the transmission line 10, the length of one period of a change of the characteristic impedance generated in the signal conductor layer 22 can be made short. More precisely, the suspended line described in Japanese Unexamined Patent Application Publication No. 62-269401 has a structure in which a plurality of existing sections and a plurality of non-existing sections are alternatively arranged. The existing section is a section in which a left through hole and a right through hole exist on the left side and the right side of a strip conductor. The non-existing section is a section in which the left through hole and the right through hole do not exist on the left side and the right side of the strip conductor. In the existing section, the characteristic impedance generated in the strip conductor becomes high. In the non-existing section, the characteristic impedance generated in the strip conductor becomes low. As a result, the characteristic impedance generated in the strip conductor periodically changes. The length of one period of the change of the characteristic impedance generated in the strip conductor is a total length of the length of one existing section and the length of one non-existing section.

On the other hand, between two interlayer connection conductors v1 adjacent to each other in the front-back direction, the transmission line 10 has the structure of a section cut along line A-A of FIG. 2, the structure of a section cut along line B-B of FIG. 2, and the structure of a section cut along line C-C of FIG. 2. Therefore, between two interlayer connection conductors v1 adjacent to each other in the front-back direction, the characteristic impedance generated in the signal conductor layer 22 changes from a high characteristic impedance to a low characteristic impedance and changes from a low characteristic impedance to a high characteristic impedance. As a result, the characteristic impedance generated in the signal conductor layer 22 periodically changes. The length of one period of the change of the characteristic impedance generated in the signal conductor layer 22 is a half of a distance D1 (see FIG. 2) of two interlayer connection conductors v1 adjacent to each other in the front-back direction.

Here, the distance D1 of two interlayer connection conductors v1 adjacent to each other in the front-back direction is a total length of the length a1 of each first hollow portion H1 in the front-back direction and the length a2 of the first region A11 in the front-back direction. Therefore, the distance D1 of two interlayer connection conductors v1 adjacent to each other in the front-back direction corresponds to a total length of the length of the existing section and the non-existing section of the suspended line described in Japanese Unexamined Patent Application Publication No. 62-269401. As a result, the length of one period of the change of the characteristic impedance generated in the signal conductor layer 22 is a half of the length of one period of the change of the characteristic impedance generated in the strip conductor. From the above, according to the transmission line 10, the length of one period of the change of the characteristic impedance generated in the signal conductor layer 22 can be made short. As a result, the frequency of a standing wave that can be generated in the signal conductor layer 22 becomes high. Therefore, a standing wave is less likely to be generated by the high frequency signal transmitted through the signal conductor layer 22.

According to the transmission line 10, deformation of the plurality of first hollow portions H1 and the plurality of second hollow portions H2 can be reduced or prevented. More precisely, in a section in which the plurality of first regions A11 and the plurality of second regions A12 are located, the transmission line 10 is less likely to be deformed. Therefore, the number of positions at which the plurality of first regions A11 and the plurality of second regions A12 are provided should increase in the transmission line 10. Therefore, each of the plurality of first hollow portions H1 overlaps with a corresponding one of the plurality of second regions A12 when viewed in the left-right direction (the second orthogonal direction). Each of the plurality of second hollow portions H2 overlaps with a corresponding one of the plurality of first region A11 when viewed in the left-right direction (the second orthogonal direction). As a result, each second region A12 is located between two first regions A11 adjacent to each other in the front-back direction. In addition, each first region A11 is located between two second regions A12 adjacent to each other in the front-back direction. As a result, the number of positions at which the plurality of first regions A11 and the plurality of second regions A12 are provided increases in the transmission line 10. As a result, according to the transmission line 10, deformation of the plurality of first hollow portions H1 and the plurality of second hollow portions H2 can be reduced or prevented. Therefore, a change of the characteristic impedance generated in the signal conductor layer 22 caused by deformation of the plurality of first hollow portions H1 and the plurality of second hollow portions H2 can be reduced or prevented.

First Modification

Figure 5:
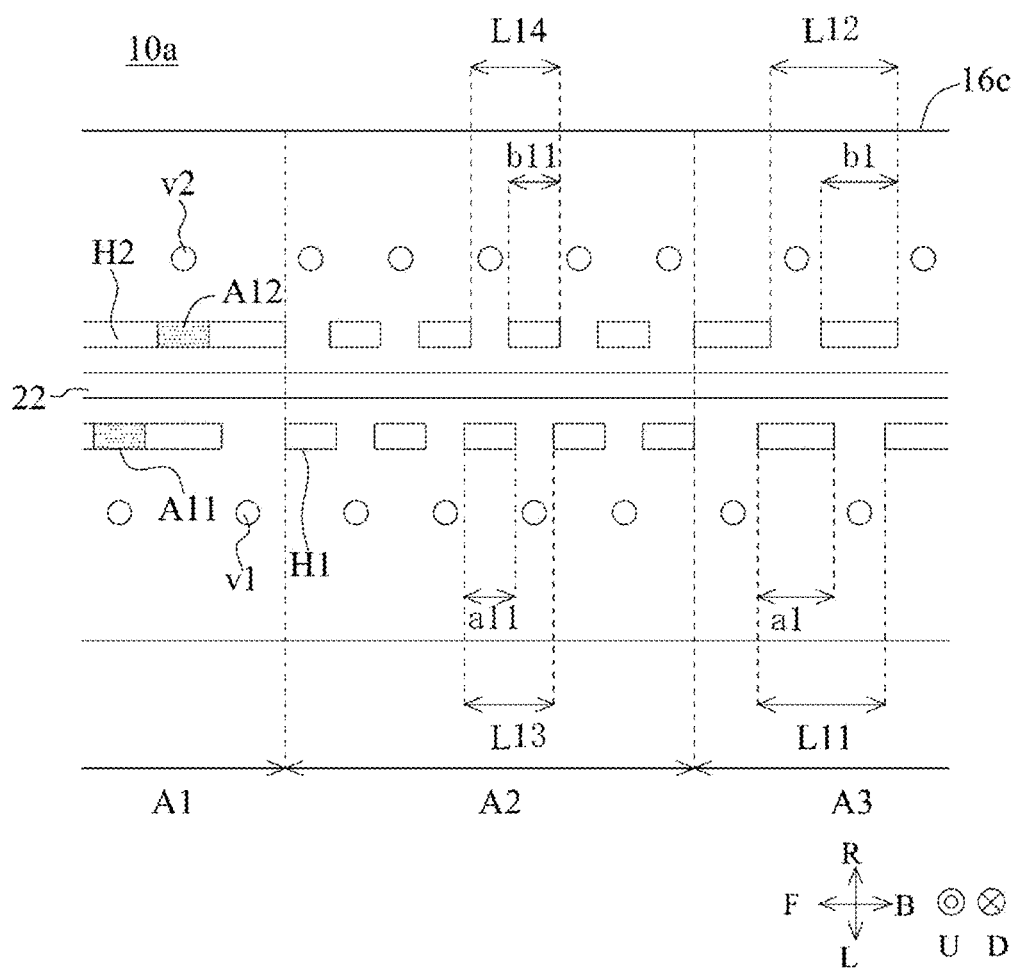

Hereinafter, a transmission line 10a according to a first modification of a preferred embodiment of the present invention will be described with reference to the drawings. FIG. 5 is a top view of the insulator layer 16c of the transmission line 10a.

The transmission line 10a is different from the transmission line 10 in the following points. A length L13 of one period of the plurality of first hollow portions H1 and a length L14 of one period of the plurality of second hollow portions H2 in the bending section A2 are shorter than the length L11 of one period of the plurality of first hollow portions H1 and the length L12 of one period of the plurality of second hollow portions H2 in the non-bending sections A1 and A3, respectively. As a result, a length a11 of the plurality of first hollow portions H1 in the front-back direction and a length b11 of the plurality of second hollow portions H2 in the front-back direction in the bending section A2 are shorter than the length a1 of the plurality of first hollow portions H1 in the front-back direction and the length b1 of the plurality of second hollow portions H2 in the front-back direction in the non-bending sections A1 and A3, respectively. Other configurations of the transmission line 10a are the same as those of the transmission line 10, and thus the description will be omitted.

According to the transmission line 10a, the same effects as the transmission line 10 are exhibited. In addition, according to the transmission line 10a, in the bending section A2, deformation of the plurality of first hollow portions H1 and the plurality of second hollow portions H2 can be reduced or prevented. More precisely, in the bending section A2, stress is generated in the multilayer body 12. Therefore, the plurality of first hollow portions H1 and the plurality of second hollow portions H2 in the bending section A2 are more likely to be deformed than the plurality of first hollow portions H1 and the plurality of second hollow portions H2 in the non-bending sections A1 and A3. Therefore, it is desired to reduce or prevent deformation of the plurality of first hollow portions H1 and the plurality of second hollow portions H2 in the bending section A2.

Therefore, the length a11 of the plurality of first hollow portions H1 in the front-back direction and the length b11 of the plurality of second hollow portions H2 in the front-back direction in the bending section A2 are shorter than the length a1 of the plurality of first hollow portions H1 in the front-back direction and the length b1 of the plurality of second hollow portions H2 in the front-back direction in the non-bending sections A1 and A3, respectively. As a result, the number of the first regions A11 and the second regions A12 that appear in the bending section A2 per unit length becomes greater than the number of the first regions A11 and the second regions A12 that appear in the non-bending section A1 and A3 per unit length. In a section in which the plurality of first regions A11 and the plurality of second regions A12 are located, the transmission line 10a is less likely to be deformed. Therefore, in the transmission line 10a, deformation of the plurality of first hollow portions H1 and the plurality of second hollow portions H2 in the bending section A2 can be reduced or prevented.

Second Modification

Figure 6:
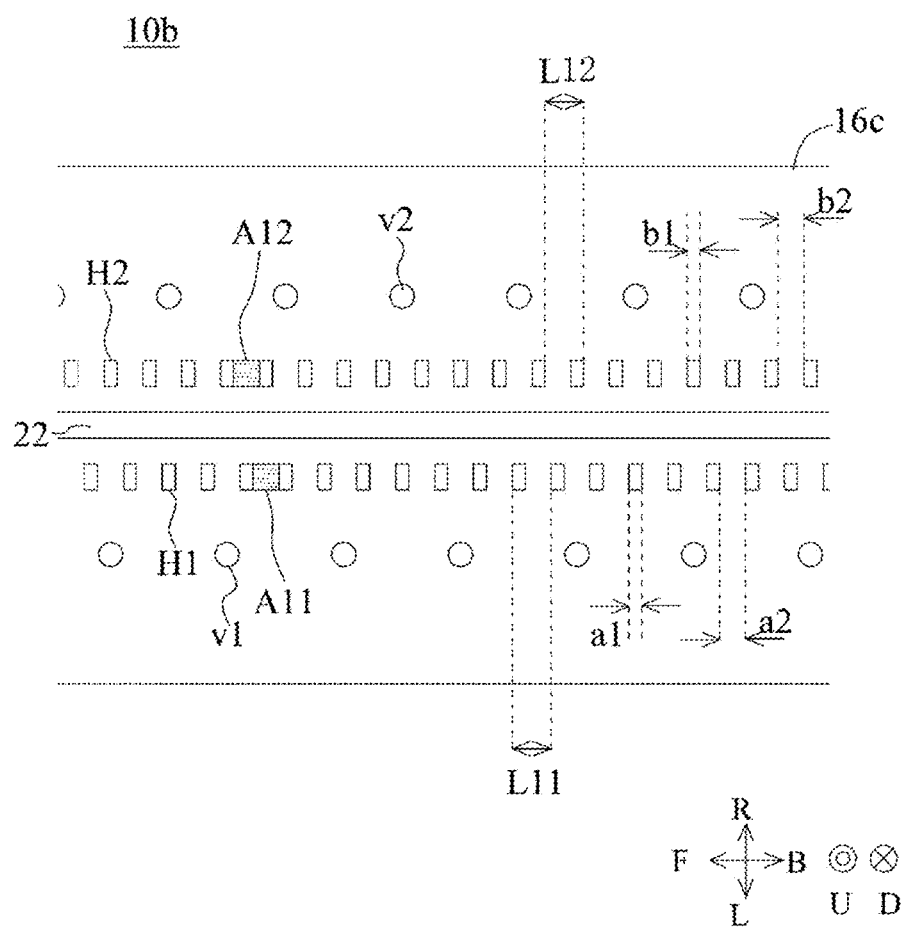
FIG. 6 is a top view of the insulator layer 16c of a transmission line 10b.

Hereinafter, a transmission line 10b according to a second modification of a preferred embodiment of the present invention will be described with reference to the drawings. FIG. 6 is a top view of the insulator layer 16c of the transmission line 10b.

The transmission line 10b is different from the transmission line 10 in that the length L11 of one period of the plurality of first hollow portions H1 and the length L12 of one period of the plurality of second hollow portions H2 are short. Between two interlayer connection conductors v1 adjacent to each other in the front-back direction, three first hollow portions H1 are provided. In addition, the length a1 of the plurality of first hollow portions H1 in the front-back direction is shorter than the length a2 of the first regions A11 in the front-back direction. Between two interlayer connection conductors v2 adjacent to each other in the front-back direction, three second hollow portions H2 are provided. In addition, the length b1 of the plurality of second hollow portions H2 in the front-back direction is shorter than the length b2 of the second regions A12 in the front-back direction. Other configurations of the transmission line 10b are the same as those of the transmission line 10, and thus the description will be omitted.

According to the transmission line 10b, the same effects as the transmission line 10 are exhibited. In addition, according to the transmission line 10b, deformation of the plurality of first hollow portions H1 and the plurality of second hollow portions H2 can be reduced or prevented. More precisely, the length a1 of the plurality of first hollow portions H1 in the front-back direction and the length b1 of the plurality of second hollow portion H2 in the front-back direction are short. As a result, the number of the first regions A11 and the second regions A12 that appear in the transmission line 10b per unit length increases. In a section in which the plurality of first regions A11 and the plurality of second regions A12 are located, the transmission line 10b is less likely to be deformed. Therefore, in the transmission line 10b, deformation of the plurality of first hollow portions H1 and the plurality of second hollow portions H2 can be reduced or prevented.

Third Modification

Hereinafter, a transmission line 10c according to a third modification of a preferred embodiment of the present invention will be described with reference to the drawings. FIG. 7 is a top view of the insulator layer 16c of the transmission line 10c.

The transmission line 10c is different from the transmission line 10 in the length a1 of the plurality of first hollow portions H1 in the front-back direction and the length b1 of the plurality of second hollow portions H2 in the front-back direction. More precisely, the plurality of first hollow portions H1 does not overlap with the plurality of second hollow portions H2 when viewed in the left-right direction. The position of the front end of each of the first hollow portions H1 in the front-back direction coincides with the position of the back end of the second hollow portions H2 located on the right-front side the first hollow portion H1 in the front-back direction. The position of the back end of the first hollow portion H1 in the front-back direction coincides with the position of the front end of the second hollow portion H2 located on the right-back side of the first hollow portion H1 in the front-back direction. Other configurations of the transmission line 10c are the same as those of the transmission line 10, and thus the description will be omitted.

According to the transmission line 10c, the same effects as the transmission line 10 are exhibited. In addition, according to the transmission line 10c, a change of the characteristic impedance generated in the signal conductor layer 22 can be further reduced or prevented. More precisely, in the transmission line 10c, on the left side or the right side of the signal conductor layer 22, either one of the first hollow portion H1 and the second hollow portion H2 is located. In other words, both of the first hollow portion H1 and the second hollow portion H2 are not located on the left and right sides of the signal conductor layer 22. As a result, the permittivity around the signal conductor layer 22 is less likely to change. Therefore, according to the transmission line 10c, a change of the characteristic impedance generated in the signal conductor layer 22 can be further reduced or prevented.

Fourth Modification

Hereinafter, a transmission line 10d according to a fourth modification of a preferred embodiment of the present invention will be described with reference to the drawings. FIG. 8 includes top views of the insulator layers 16c, 18a, and 18b of the transmission line 10d.

The transmission line 10d is different from the transmission line 10 in that a plurality of first hollow portions H11 is provided in the insulator layer 18a, and that a plurality of second hollow portions H12 is provided in the insulator layer 18b. In the transmission line 10d, the first orthogonal direction is the left-right direction.

When viewed in the left-right direction (the first orthogonal direction), the plurality of first hollow portions H11 is arranged in the front-back direction above (the first direction) the signal conductor layer 22. The plurality of first hollow portions H11 overlaps with the first ground conductor layer 24 when viewed in the up-down direction. In addition, each of regions located between two first hollow portions H11 adjacent to each other in the front-back direction is defined as a first region A21. A plurality of the first regions A21 is arranged in the front-back direction at equal or substantially equal intervals.

When viewed in the left-right direction (the first orthogonal direction), the plurality of second hollow portions H12 is arranged in the front-back direction under (the second direction) the signal conductor layer 22. In addition, each of regions located between two second hollow portions H12 adjacent to each other in the front-back direction is defined as a second region A22. A plurality of the second regions A22 is arranged in the front-back direction at equal or substantially equal intervals.

The plurality of first hollow portions H11 and the plurality of second hollow portions H12 are each periodically arranged. The length L11 of one period of the plurality of first hollow portions H11 is equal to the length L12 of one period of the plurality of second hollow portions H12. The length L11 of one period of the plurality of first hollow portions H11 is a total length of the length of each first hollow portion H11 in the front-back direction and the length of each first region A21 in the front-back direction. The length L12 of one period of the plurality of second hollow portion H12 is a total length of the length of each second hollow portion H12 in the front-back direction and the length of each second region A22 in the front-back direction. The length of the plurality of first hollow portions H11 in the front-back direction is equal to the length of the plurality of second hollow portions H12 in the front-back direction. The length of the plurality of first regions A21 in the front-back direction is equal to the length of the plurality of second regions A22 in the front-back direction. However, the position of the plurality of first hollow portions H11 in the front-back direction is deviated from the position of the plurality of second hollow portions H12 in the front-back direction by the length of a half period in the front-back direction. As a result, the plurality of first hollow portions H11 is located above (the first direction) the plurality of second regions A22, respectively. That is, each of the plurality of first hollow portions H11 overlaps with a corresponding one of the plurality of second regions A22 when viewed in the up-down direction (the second orthogonal direction). The plurality of second hollow portions H12 is located below (the second direction) the plurality of first regions A21, respectively. That is, each of the plurality of second hollow portions H12 overlaps with a corresponding one of the plurality of first regions A21 when viewed in the up-down direction (the second orthogonal direction).

Note that the insulator layers 16b and 16c are not provided with the first hollow portions H1 and the second hollow portions H2. Other configurations of the transmission line 10d are the same as those of the transmission line 10, and thus the description will be omitted.

According to the transmission line 10d, the same effects as the transmission line 10 are exhibited. In addition, since the insulator layers 16b and 16c are not provided with the first hollow portions H1 and the second hollow portions H2, the strength of the transmission line 10d becomes high. In addition, the left end of the first regions A21 is fixed to a left portion of the insulator layer 18a, and at the same time, the right end of the first regions A21 is fixed to a right portion of the insulator layer 18a. As a result, the first regions A21 are less likely to be deformed. As a result, the first hollow portions H11 are less likely to be deformed. For the same reason as the first regions A21, the second regions A22 are less likely to be deformed. As a result, the second hollow portions H12 are less likely to be deformed.

Fifth Modification

Figure 9:
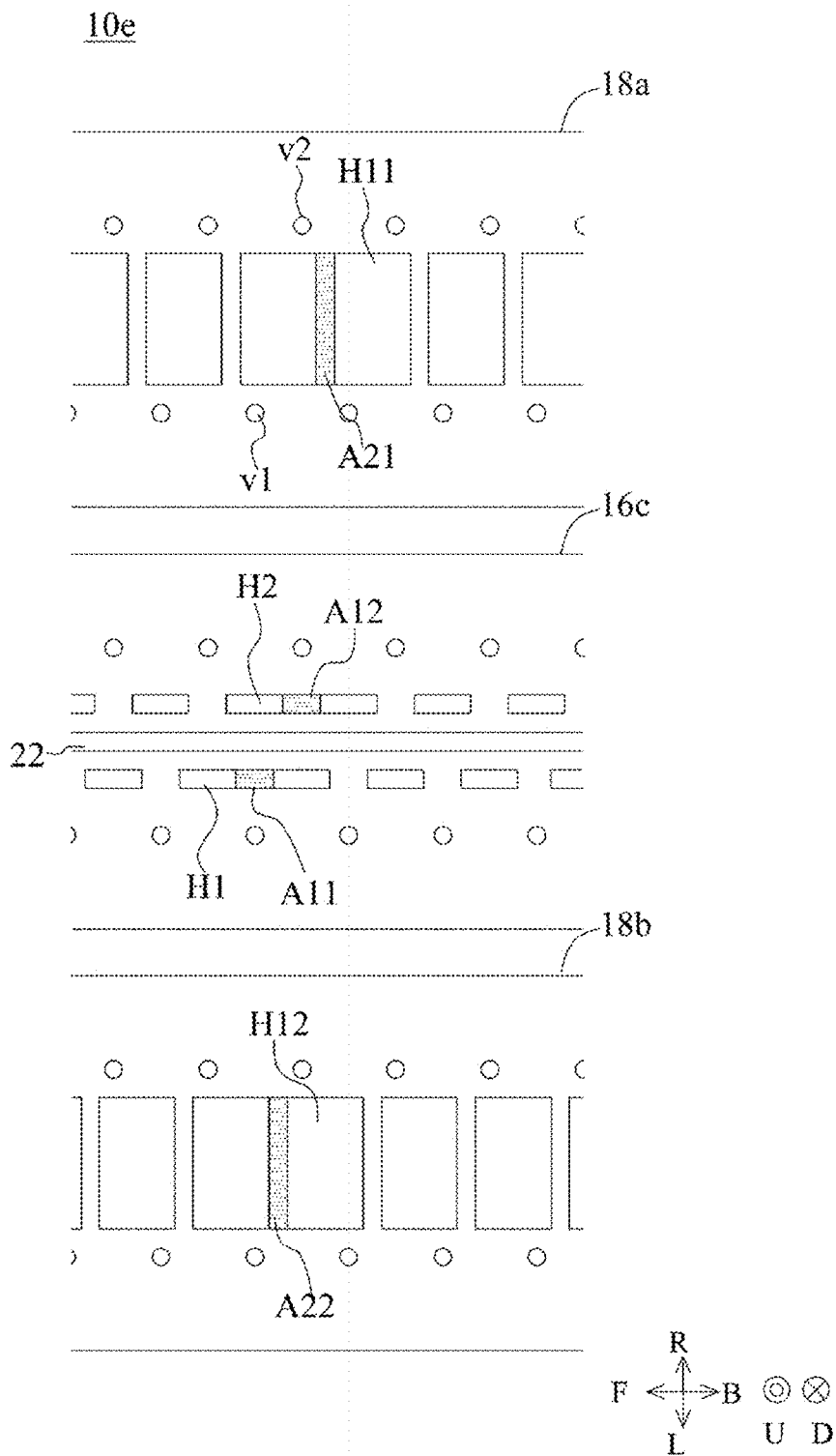
FIG. 9 includes top views of the insulator layers 16c, 18a, and 18b of a transmission line 10e.

Hereinafter, a transmission line 10e according to a fifth modification of a preferred embodiment of the present invention will be described with reference to the drawings. FIG. 9 includes top views of the insulator layers 16c, 18a, and 18b of the transmission line 10e.

The transmission line 10e is different from the transmission line 10d in that the plurality of first hollow portions H1 and the plurality of the second hollow portions H2 are provided in the insulator layers 16c. In addition, the positions of the first regions A11 in the front-back direction, the positions of the second regions A12 in the front back direction, the positions of the first regions A21 in the front-back direction, and the positions of the second regions A22 in the front-back direction are different from each other. Other configurations of the transmission line 10e are the same as those of the transmission line 10, and thus the description will be omitted. According to the transmission line 10e, the same effects as the transmission line 10d are exhibited.

Sixth Modification

Figure 10:
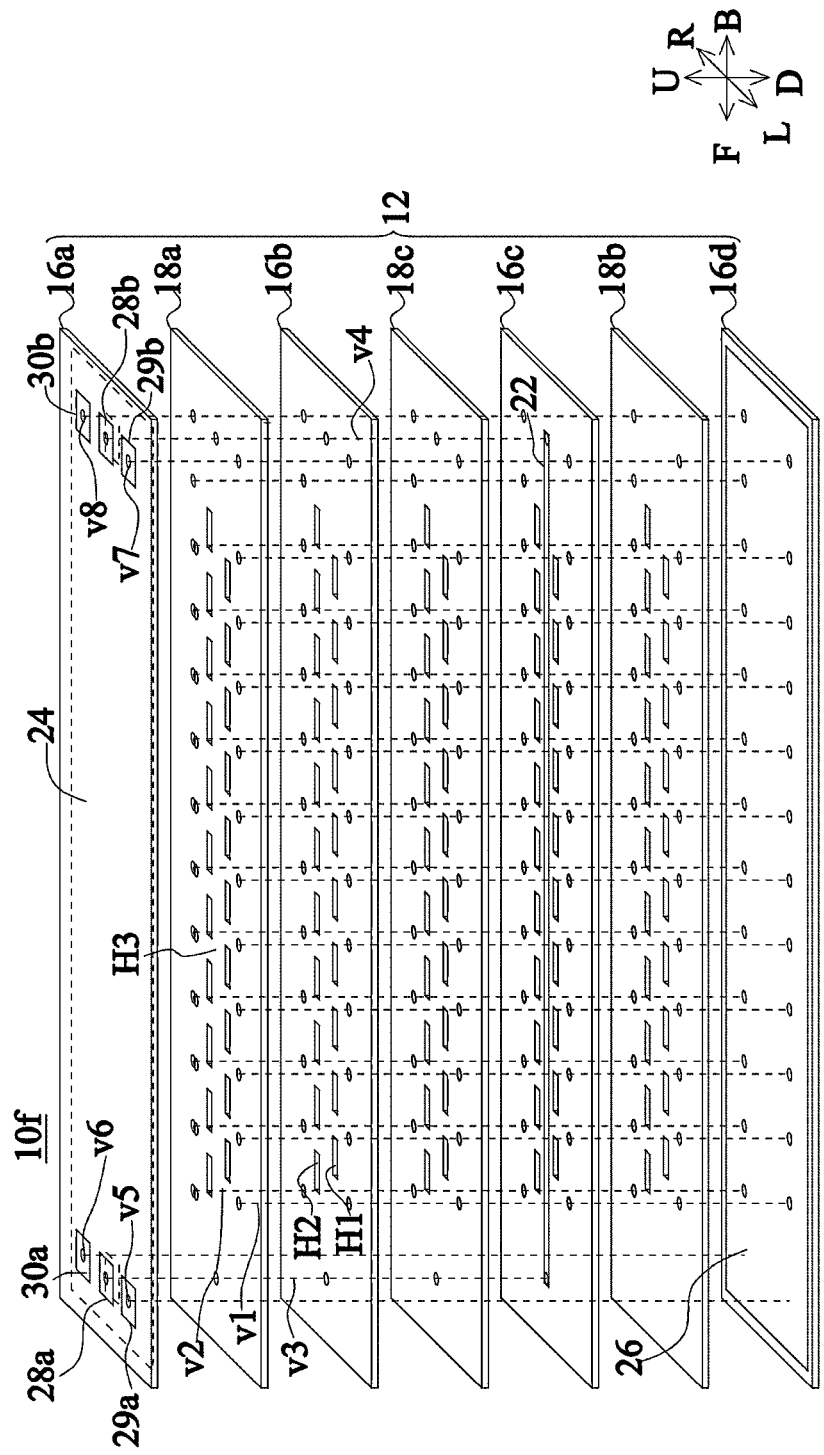
FIG. 10 is an exploded perspective view of a transmission line 10f.

Hereinafter, a transmission line 10f according to a sixth modification of a preferred embodiment of the present invention will be described with reference to the drawings. FIG. 10 is an exploded perspective view of the transmission line 10f.

The transmission line 10f is different from the transmission line 10 in the following points. The third hollow portion H3 and the fourth hollow portion H4 are not provided in the insulator layers 18a and 18b, respectively. The first hollow portion H1 and the second hollow portion H2 are provided in the insulator layers 18a and 18b, respectively.

Other structures of the transmission line 10f are the same as those of the transmission line 10, and thus the description will be omitted. The transmission line 10f exhibits the same effects as the transmission line 10. According to the transmission line 10f, the first hollow portions H1 and the second hollow portions H2 can be simultaneously formed in the insulator layers 16b, 16c, 18a, and 18b.

Seventh Modification

Figure 11:
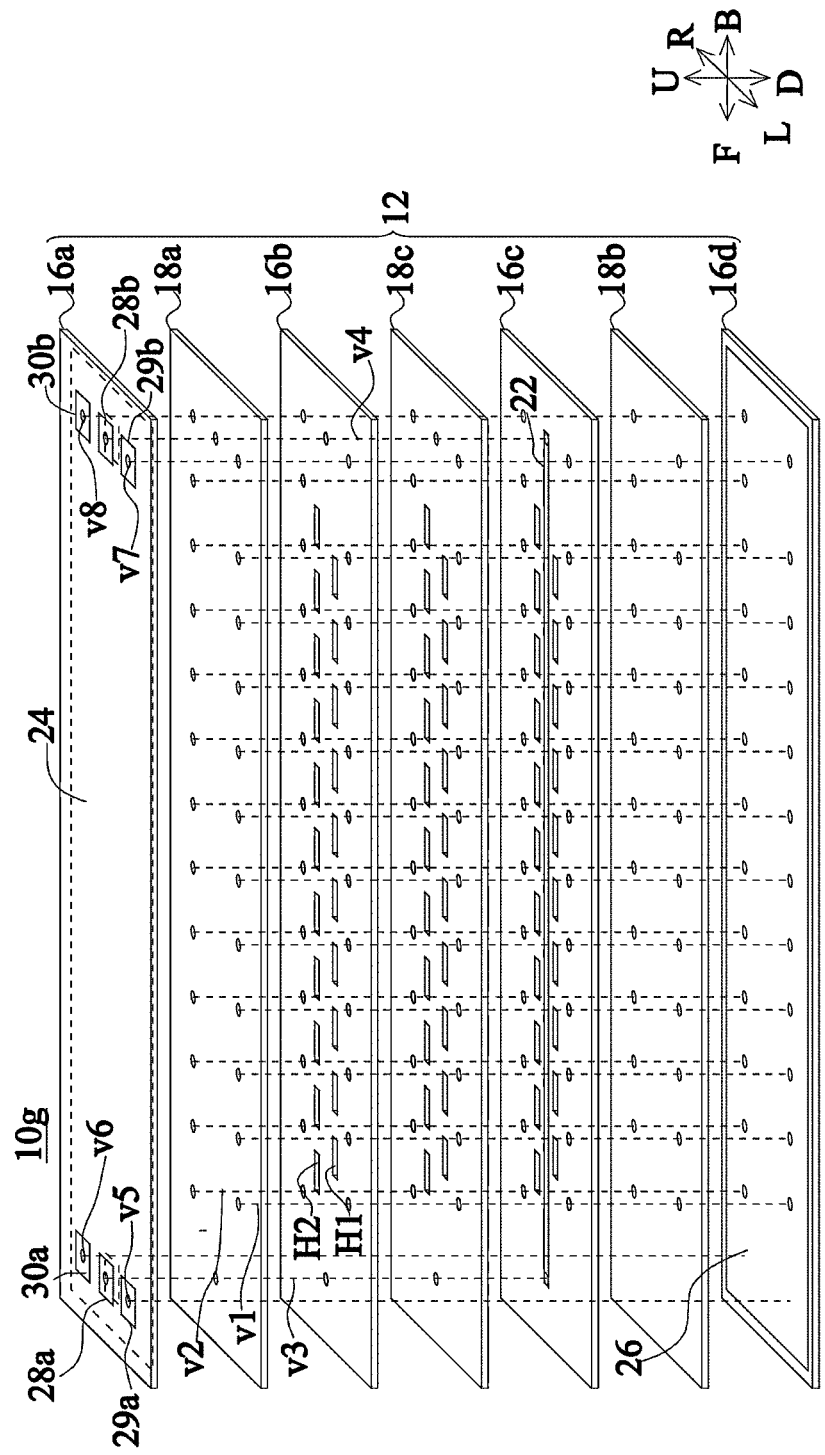
FIG. 11 is an exploded perspective view of a transmission line 10g.

Hereinafter, a transmission line 10g according to a seventh modification of a preferred embodiment of the present invention will be described with reference to the drawings. FIG. 11 is an exploded perspective view of the transmission line 10g.

The transmission line 10g is different from the transmission line 10 in that the third hollow portion H3 and the fourth hollow portion H4 are not provided in the insulator layers 18a and 18b, respectively. Other configurations of the transmission line 10g are the same as those of the transmission line 10, and thus the description will be omitted. According to the transmission line 10g, the same effects as the transmission line 10 are exhibited. In addition, according to the transmission line 10g, a change of the characteristic impedance generated in the signal conductor layer 22 caused by deformation of the third hollow portion H3 and the fourth hollow portion H4 can be reduced or prevented.

Eighth Modification

Figure 12:
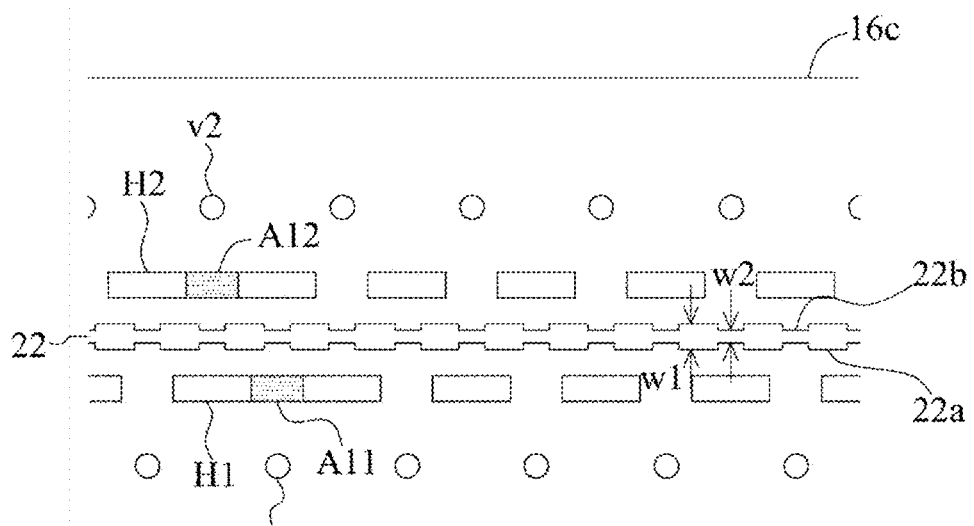
FIG. 12 is a top view of the insulator layer 16c of a transmission line 10h.

Hereinafter, a transmission line 10h according to an eighth modification of a preferred embodiment of the present invention will be described with reference to the drawings. FIG. 12 is a top view of the insulator layer 16c of the transmission line 10h.

The transmission line 10h is different from the transmission line 10 in the shape of the signal conductor layer 22. In the transmission line 10h, the signal conductor layer 22 includes a plurality of thick line portions 22a and a plurality of thin line portions 22b. A width w1 of the thick line portions 22a in the left-right direction is larger than a width w2 of the thin line portions 22b in the left-right direction. The plurality of thick line portions 22a and the plurality of thin line portions 22b are alternatively arranged in the front-back direction. In addition, the plurality of thin line portions 22b overlaps with the pluralities of interlayer connection conductors v1 and v2 when viewed in the left-right direction. Note that other configurations of the transmission line 10h are the same as those of the transmission line 10, and thus the description will be omitted.

The transmission line 10h exhibits the same effects as the transmission line 10. In addition, according to the transmission line 10h, the distance between the pluralities of interlayer connection conductors v1 and v2 and the plurality of thin line portions 22b becomes large. Therefore, capacitance is less likely to be generated between the pluralities of interlayer connection conductors v1 and v2 and the plurality of thin line portions 22b. As a result, the characteristic impedance generated in the signal conductor layer 22 becomes high. In the transmission line 10, since the line width of the signal conductor layer 22 is uniform, by the capacitance generated between the signal conductor layer 22 and the pluralities of interlayer connection conductors v1 and v2, the characteristic impedance generated in the signal conductor layer 22 changes. On the other hand, in the transmission line 10h, by the thick line portions 22a and the thin line portions 22b, the change of the characteristic impedance generated in signal conductor layer 22 becomes small.

Ninth Modification

Hereinafter, a transmission line 10i according to a ninth modification of a preferred embodiment of the present invention will be described with reference to the drawings. FIG. 13 is a top view of the insulator layer 16c of the transmission line 10i.

The transmission line 10i is different from the transmission line 10 in the positional relationship between the plurality of first hollow portions H1 and the plurality of interlayer connection conductors v1, and the positional relationship between the plurality of second hollow portions H2 and the plurality of interlayer connection conductors v2. More precisely, when viewed in the left-right direction, the plurality of first hollow portions H1 overlaps with the plurality of interlayer connection conductors v1. When viewed in the left-right direction, the plurality of second hollow portions H2 overlaps with the plurality of interlayer connection conductors v2. Other configurations of the transmission line 10i are the same as those of the transmission line 10, and thus the description will be omitted.

The transmission line 10i exhibits the same effects as the transmission line 10. In addition, according to the transmission line 10i, a change of the characteristic impedance generated in the signal conductor layer 22 can be reduced or prevented. More precisely, when viewed in the left-right direction, the plurality of first hollow portions H1 overlaps with the plurality of interlayer connection conductors v1. As a result, generation of capacitance between the signal conductor layer 22 and the plurality of interlayer connection conductors v1 can be reduced or prevented. In addition, when viewed in the left-right direction, the plurality of second hollow portions H2 overlaps with the plurality of interlayer connection conductors v2. As a result, generation of capacitance between the signal conductor layer 22 and the plurality of interlayer connection conductors v2 can be reduced or prevented. As a result, a change of the characteristic impedance generated in the signal conductor layer 22 can be reduced or prevented. In addition, since the capacitance is less likely to be generated between the signal conductor layer 22 and the pluralities of interlayer connection conductors v1 and v2, the line width of the signal conductor layer 22 can be increased. As a result, a DC resistance value of the signal conductor layer 22 can be reduced.

Tenth Modification

Hereinafter, a transmission line 10j according to a tenth modification of a preferred embodiment of the present invention will be described with reference to the drawings. FIG. 14 is a top view of the insulator layer 16c of the transmission line 10j.

The transmission line 10j is different from the transmission line 10 in that the transmission line 10j is bent. "The transmission line 10j is bent" means that the transmission line 10j has a bent shape in a state where no external force is applied to the transmission line 10j. Note that in this case, the front-back direction is different depending on the position of the signal conductor layer 22.

In the transmission line 10j, the length b1 in the front-back direction of each second hollow portion H2 that is located further on the outer peripheral side than is the signal conductor layer 22 is greater than the length a1 in the front-back direction of each first hollow portion H1 that is located further on the inner peripheral side than is the signal conductor layer 22. Other configurations of the transmission line 10j are the same as those of the transmission line 10, and thus the description will be omitted. The transmission line 10j exhibits the same effects as the transmission line 10.

Other Preferred Embodiments

Transmission lines according to preferred embodiments are not limited to the transmission lines 10, and 10a to 10j and can be modified within the scope of the gist of the present invention. Note that the configurations of the transmission lines 10, and 10a to 10j may be appropriately combined.

Note that the transmission lines 10, and 10a to 10j may include a plurality of signal conductor layers. In this case, the plurality of signal conductor layers may define, for example, a differential transmission line. In addition, the plurality of signal conductor layers does not have to be provided on the same insulator layer.

Note that in the transmission lines 10, and 10a to 10j, the signal terminals 28a and 28b, and the ground terminals 29a, 29b, 30a, and 30b may be provided on the lower main surface of the multilayer body 12.

Note that the transmission lines 10, and 10a to 10j may further include other circuits in addition to the strip lines.

Note that on the transmission lines 10, and 10a to 10j, an electronic component other than the connectors 32a and 32b may be mounted. The electronic component is, for example, a chip inductor, a chip capacitor, and the like.

Note that the second ground conductor layer 26 is not a necessary element. In this case, the signal conductor layer 22 and the first ground conductor layer 24 configure a microstrip line structure.

Note that a protective layer may be provided on the insulator layer 16a.

Note that the material of one or more insulator layers of the plurality of insulator layers 16a to 16d may be a porous material. A porous structure is a structure in which a plurality of small bubbles is dispersed in the entire insulator layer manufactured with a porous material. The insulator layer manufactured with a porous material includes a plurality of closed cells. The closed cells have a structure in which an entire bubble is surrounded by the material of the insulator layer, and thus gas inside the bubble cannot leak outside of the insulator layer. In addition, in the closed cells, adjacent bubbles are not connected to each other. The porosity of the insulator layer manufactured with a porous material is, for example, equal to or greater than about 30% and equal to or less than about 80%. The porosity is the ratio of the volume of bubbles occupying the entire volume of the insulator layer manufactured with a porous material. In this manner, since the porous material contains air, the porous material has low permittivity. As a result, the permittivity around the signal conductor layer 22 becomes low, and dielectric loss is less likely to occur in the high frequency signal transmitted through the signal conductor layer 22. That is, the high frequency characteristics of the transmission lines 10, and 10a to 10j improve.

Note that the material of the insulator layers 18a and 18b may be a thermoplastic resin.

Note that the length a1 of the plurality of first hollow portions H1 in the front-back direction may be equal or substantially equal to the length a2 of the first regions A11 in the front-back direction. The length b1 of the plurality of second hollow portions H2 in the front-back direction may be equal to the length b2 of the second regions A12 in the front-back direction.

Note that the shape of the plurality of first hollow portions H1 does not have be uniform. The shape of the plurality of second hollow portions H2 does not have to be uniform.

Note that the length of the first regions A11 in the front-back direction does not have to be uniform. The length of the second regions A12 in the front-back direction does not have to be uniform.

Note that the signal conductor layer 22 may be provided on the upper main surface of the insulator layer 16c, and a signal conductor layer may be provided on the lower main surface of the insulator layer 16c.

Note that the interlayer connection conductors v1 to v8 may penetrate a portion of the insulator layers 16a to 16d, 18a, and 18b in the up-down direction as illustrated in FIG. 1, or may penetrate the insulator layers 16a to 16d, 18a, and 18b in the up-down direction.

Note that a case in which the position of the plurality of first hollow portions H1 in the front-back direction is deviated from the position of the plurality of second hollow portions H2 in the front-back direction by the length of a half period in the front-back direction has been exemplified. However, the amount of deviation does not have to be a half period.

Note that in the transmission line 10 illustrated in FIG. 3, the first hollow portions H1 may be located at the same position of the left end of the third hollow portion H3 or further on the left side than is the left end of the third hollow portion H3. That is, the distance between the first hollow portions H1 and the signal conductor layer 22 in the left-right direction may be longer than the distance between the left end of the third hollow portion H3 and the signal conductor layer 22 in the left-right direction. The second hollow portions H2 may be located on the same position of the right end of the fourth hollow portion H4 or further on the right side than is the right end of the fourth hollow portion H4. That is, the distance between the second hollow portions H2 and the signal conductor layer 22 in the left-right direction may be longer than the distance between the right end of the fourth hollow portion H4 and the signal conductor layer 22 in the left-right direction. Note that the volume of the first hollow portions H1 and the volume of the second hollow portions H2 are preferably large.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A transmission line comprising:
a multilayer body including a plurality of insulator layers laminated in an up-down direction;
a signal conductor layer in the multilayer body and extending in a front-back direction orthogonal to the up-down direction; and
a first ground conductor layer in the multilayer body and above the signal conductor layer to overlap with the signal conductor layer when viewed in the up-down direction; wherein
the multilayer body includes a plurality of first hollow portions and a plurality of second hollow portions;
the plurality of first hollow portions and the plurality of second hollow portions overlap with the first ground conductor layer when viewed in the up-down direction;
a direction orthogonal to the front-back direction is a first orthogonal direction, and a direction orthogonal to the front-back direction and the first orthogonal direction is a second orthogonal direction;
the second orthogonal direction includes a first direction and a second direction that is a direction opposite to the first direction;
when viewed in the first orthogonal direction, the plurality of first hollow portions is arranged in the front-back direction in the first direction of the signal conductor layer;
when viewed in the first orthogonal direction, the plurality of second hollow portions is arranged in the front-back direction in the second direction of the signal conductor layer;

regions each located between two of the first hollow portions adjacent to each other in the front-back direction are a plurality of first regions;

regions each located between two of the second hollow portions adjacent to each other in the front-back direction are a plurality of second regions;

each of the plurality of first hollow portions overlaps with a corresponding one of the plurality of second regions when viewed in the second orthogonal direction; and each of the plurality of second hollow portions overlaps with a corresponding one of the plurality of first regions when viewed in the second orthogonal direction.

2. The transmission line according to claim 1, wherein the first orthogonal direction is the up-down direction.

3. The transmission line according to claim 1, wherein the first orthogonal direction is a left-right direction.

4. The transmission line according to claim 1, wherein the second orthogonal direction is the up-down direction.

5. The transmission line according to claim 1, wherein the second orthogonal direction is a left-right direction.

6. The transmission line according to claim 1, wherein the first direction is a left direction and the second direction is a right direction.

7. The transmission line according to claim 1, wherein the plurality of insulator layers includes insulator layers that define and function as an adhesion layer; and
the adhesion layer joins one of the insulator layers above the adhesion layer and one of the insulator layers below the adhesion layer.

8. The transmission line according to claim 7, wherein the first ground conductor layer is provided on one of the insulator layers above the adhesion layer; and
the signal conductor layer is provided on one of the insulator layers below the adhesion layer.

9. The transmission line according to claim 1, wherein a material of the plurality of insulator layers is a thermoplastic resin.

10. The transmission line according to claim 1, wherein a material of one or more of the plurality of insulator layers is a porous material.

11. The transmission line according to claim 1, wherein each of the plurality of first hollow portions has a same shape; and
each of the plurality of second hollow portions has a same shape.

12. The transmission line according to claim 1, wherein the plurality of first hollow portions is arranged at equal or substantially equal intervals; and
the plurality of second hollow portions is arranged at equal or substantially equal intervals.

13. The transmission line according to claim 1, wherein a front end portion of each of the first hollow portions overlaps with one of the second hollow portions located before one of the second regions located in the second direction of the first hollow portion, when viewed in the second orthogonal direction;
a back end portion of the first hollow portion overlaps with one of the second hollow portions located after the second region located in the second direction of the first hollow portion, when viewed in the second orthogonal direction;
a front end portion of each of the second hollow portions overlaps with one of the first hollow portions located before one of the first regions located in the first direction of the second hollow portion, when viewed in the second orthogonal direction; and
a back end portion of the second hollow portion overlaps with one of the first hollow portions located after the first region located in the first direction of the second hollow portion, when viewed in the second orthogonal direction.

14. The transmission line according to claim 1, wherein the transmission line has a bent shape.

15. The transmission line according to claim 1, further comprising a plurality of signal conductors.

16. The transmission line according to claim 1, wherein the transmission line is a differential transmission line.

17. An electronic device comprising the transmission line according to claim 1.

18. The electronic component according to claim 17, wherein the electronic component is a chip inductor or a chip capacitor.

* * * * *